1 United States Patent	(10) Patent No.: US 8,339,866 B2
Imamoto et al.	(45) Date of Patent: Dec. 25, 2012

(54) SEMICONDUCTOR MEMORY DEVICE (75) Inventors: Akihiro Imamoto, Kanagawa-ken (JP); Osamu Nagao, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 426 days.

(21) Appl. No.: 12/570,259

(22) Filed: Sep. 30, 2009

(65) Prior Publication Data

US 2010/0080069 A1  Apr. 1, 2010

(30) Foreign Application Priority Data

Oct. 1, 2008  (JP) .................................. 2008-256167

(51) Int. Cl.
G11C 16/14 (2006.01)
G11C 16/16 (2006.01)
G11C 16/06 (2006.01)
G11C 16/04 (2006.01)
G11C 16/10 (2006.01)
G11C 16/34 (2006.01)
G11C 16/08 (2006.01)

(52) U.S. Cl. ......... 365/185.29; 365/185.17; 365/185.18; 365/185.19; 365/185.11; 365/185.22; 365/185.23; 365/185.27

(58) Field of Classification Search ............. 365/185.29, 365/185.17, 185.23, 185.27, 185.22, 185.18, 365/185.11, 185.19
See application file for complete search history.

(56) References Cited

U.S. PATENT DOCUMENTS 6,262,926 B1 * 7/2001 Nakai ........................... 365/200
7,457,166 B2 11/2008 Hemink et al.
2003/0147286 A1 * 8/2003 Tanaka et al. ............ 365/185.17

* cited by examiner

*Primary Examiner* — J. H. Hur
(74) *Attorney, Agent, or Firm* — Oblon, Spivak, McClelland, Maier & Neustadt, L.L.P.

(57) ABSTRACT

A NAND type flash memory for erasing data every block including plural memory cell transistors that are provided every block and have floating gates formed through first gate insulating film above a well formed in a semiconductor substrate and control gates formed through second gate insulating film above the floating gates, data in the memory cell transistors being rewritable by controlling charge amounts accumulated in the floating gates, and a row decoder having a plurality of MOS transistors having drains that are respectively connected to corresponding word lines connected to the control gates of the plurality of memory cell transistors, the row decoder controlling gate and source voltages of the MOS transistors.

9 Claims, 11 Drawing Sheets

SEMICONDUCTOR MEMORY DEVICE

CROSS-REFERENCE TO RELATED APPLICATION

This application is based upon and claims the benefit of priority from the prior Japanese Patent Application No. 2008-256167, filed on Oct. 1, 2008, the entire contents of which are incorporated herein by reference.

BACKGROUND OF THE INVENTION

The present invention relates to a semiconductor memory device for writing/erasing data into/from a memory cell transistor with tunneling current.

Data erasure of a NAND type flash memory is executed every block, that is, data erasure is executed on all memory cell transistors in a selected block concurrently. In other words, data erasure is never executed on all memory cell transistors of non-selected blocks (for example, see JP-A-7-169284).

Here, in an erasing operation of a NAND flash memory, a boosted erasure voltage (for example, about 20V) is applied to the well of a memory cell transistor, and further a voltage of 0V is applied to all word lines WL of a selected block.

On the other hand, all word lines WL of non-selected blocks are controlled to be under a floating state. Accordingly, When the erasure voltage (about 20V) is applied to the well, a voltage having the same level as the boosted erasure voltage (20V) is applied to all the word lines WL of the non-selected blocks due to coupling. Here, the word lines WL are connected to the drain side of MOS transistors of a row decoder. In the erasing operation, the MOS transistors connected to the word lines WL of the selected block are set to ON state, and the source voltage thereof is controlled to 0V. On the other hand, the MOS transistors connected to the word lines WL of the non-selected blocks are set to OFF state (the gate voltage is set to 0V) and the source voltage is controlled to 0V.

Accordingly, when the erasure voltage is applied to the well as described above, the MOS transistors connected to the word lines WL of the non-selected blocks are set to the state that 20V is applied to the drains thereof, 0V is applied to the gates thereof and 0V is applied to the sources thereof. When this state is continued, the cut-off characteristics of the MOS transistors concerned are deteriorated, and thus leak current increases. Accordingly, the potential of the word lines WL of the non-selected blocks are lowered during erasing operation. When the potential of the word lines WL of the non-selected blocks is lowered to some level, erroneous erasure occurs. That is, as the erasing time (the time for which the erasure voltage is continued to be applied to the well) is longer, the voltage drop of the word lines WL of the non-selected blocks is more intense, so that erroneous erasure occurs with higher probability.

BRIEF SUMMARY OF THE INVENTION

According to an aspect of the present invention, a NAND type flash memory for erasing data every block includes: a plurality of memory cell transistors that are provided every block and have floating gates formed through first gate insulating film above a well formed in a semiconductor substrate and control gates formed through second gate insulating film above the floating gates, data in the memory cell transistors being rewritable by controlling charge amounts accumulated in the floating gates; and a row decoder having a plurality of MOS transistors having drains that are respectively connected to corresponding word lines connected to the control gates of the plurality of memory cell transistors, the row decoder controlling gate and source voltages of the MOS transistors, wherein in an erasing operation, first MOS transistors that are contained in the MOS transistors and have drains connected to the word lines connected to the control gates of memory cell transistors of a selected block are turned on to fix the control gates of the memory cell transistors of the selected block to a first voltage, second MOS transistors that are contained in the MOS transistors and have drains connected to the word lines connected to the control gates of memory cell transistors of non-selected blocks are turned off to set the control gates of the memory cell transistors of the non-selected blocks to a floating state, the erasing voltage higher than the first voltage is applied to the well at only a specified frequency, and then it is verified whether a threshold value voltage of the memory cell transistors of the selected block is not more than a first threshold value voltage corresponding to an erasure state.

According to another aspect of the present invention, a semiconductor memory device for erasing data every block includes: a plurality of memory cell transistors that are provided every block and have floating gates formed through first gate insulating film above a well formed in a semiconductor substrate and control gates formed through second gate insulating film above the floating gates, data in the memory cell transistors being rewritable by controlling charge amounts accumulated in the floating gates; and a row decoder having a plurality of MOS transistors having drains that are respectively connected to corresponding word lines connected to the control gates of the plurality of memory cell transistors, the row decoder controlling gate and source voltages of the MOS transistors, wherein in an erasing operation, first MOS transistors that are contained in the MOS transistors and have drains connected to the word lines connected to the control gates of memory cell transistors of a selected block are turned on to fix the control gates of the memory cell transistors of the selected block to a first voltage, and second MOS transistors that are contained in the MOS transistors and have drains connected to the word lines connected to the control gates of memory cell transistors of non-selected blocks are turned off to set the control gates of the memory cell transistors of the non-selected blocks to a floating state, whereby the erasing voltage higher than the first voltage is applied to the well at only a specified frequency while the erasing voltage is stepwise increased, and then it is verified whether a threshold value voltage of the memory cell transistors of the selected block is not more than a first threshold value voltage corresponding to an erasure state.

DETAILED DESCRIPTION OF THE INVENTION

Figure 11:
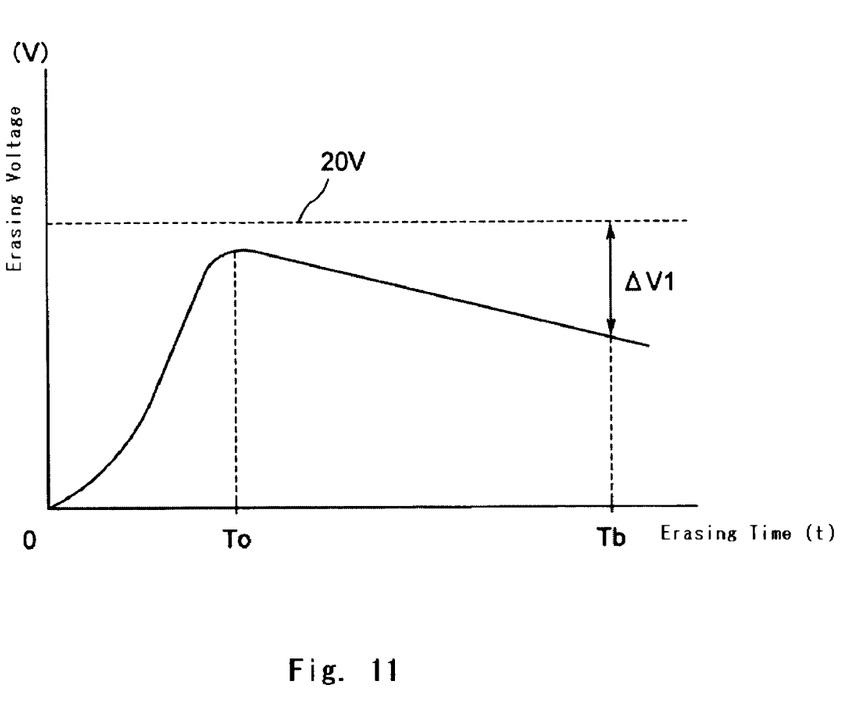
FIG. 11 is a diagram showing the relation between a voltage of a word line and an erasure time in a conventional erasing operation.

FIG. 11 is a diagram showing the relation between a voltage of a word line and an erasure time in a conventional erasing operation.

For example, when an erasure voltage of 20V is applied to a well as shown in FIG. 11, the potential of word lines of non-selected blocks is increased to the same potential level as the erasure voltage due to the coupling between the well and a control gate (word line) (time T0). As described above, during the period for which the erasure voltage is applied to the well, MOS transistors connected to the word lines of the non-selected blocks are set to OFF state. That is, about 20V is applied to the drains of the MOS transistors, 0V is applied to the gates of the MOS transistors, and 0V is applied to the sources of the MOS transistors. When this state is continued, the cut-off characteristics of the MOS transistors are deteriorated, and leak current increases.

When the current continues to leak, the voltage of the word lines of the non-selected blocks is gradually dropped. When the voltage drop amount of the word lines is increased, the potential difference between the well and WL of the non-selected blocks (the potential difference $\Delta V1$ at the time Tb). Accordingly, there may occur such an erroneous erasure that the data of the memory cell transistors of the non-selected blocks are erased.

Therefore, according to the NAND type flash memory of the present invention, in data erasure, data which are originally erased by one shot of an original erasure pulse are erased while the one shot of the original pulse is divided into plural shots of the original erasure pulse (that is, the application time per one shot of the erasure pulse is shortened). Accordingly, in the data erasure, the leak current in the MOS transistors connected to the word lines of the non-selected blocks is reduced. Accordingly, the voltage drop of the word lines of the non-selected blocks can be suppressed, and the erroneous erasure of data in the non-selected blocks can be prevented.

First Embodiment

Figure 1:
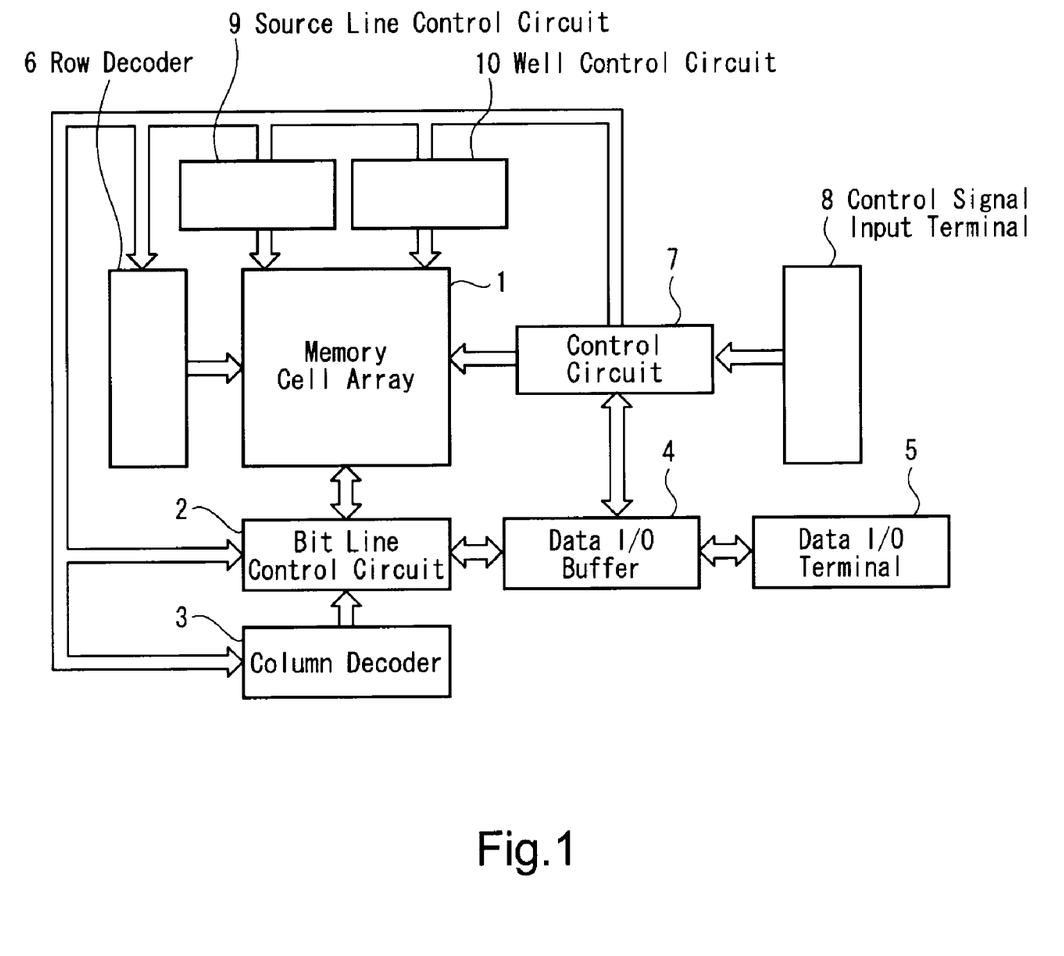
FIG. 1 is a block diagram showing an example of the construction of a NAND type flash memory according to a first embodiment.

FIG. 1 is a block diagram showing an example of the construction of a NAND type flash memory 100 according to a first embodiment of the present invention.

As shown in FIG. 1, the NAND type flash memory 100 has a memory cell array 1, a bit line control circuit 2, a column decoder 3, a data input/output buffer 4, a data input/output terminal 5, a row decoder 6, a control circuit 7, a control signal input terminal 8, a source line control circuit 9 and a well control circuit 10.

The memory cell array 1 contains plural bit lines, plural word lines and a common source line. In the memory cell array 1, electrically data-rewritable memory cell transistors formed of EEPROM cells are disposed in a matrix arrangement, for example.

The bit line control circuit 2 for controlling the potential of the bit lines and the row decoder 6 for controlling the potential of the word lines are connected to the memory cell array 1. The plural memory cell transistors are arranged while divided into plural blocks. During the erasing operation, some block is selected by the row decoder 6, and the other blocks are non-selected.

The bit line control circuit 2 contains data storage circuits each of which serves as both a sense amplifier for sense-amplifying the potential of the bit lines in the memory cell array 1 and a data latch circuit for latching data to be written. The bit line control circuit 2 reads out data of the memory cell transistors in the memory cell array 1 through the bit lines, detects the states of the memory cell transistors through the bit lines, and writes data into the memory cell transistors by applying a writing control voltage to the memory cell transistors through the bit lines.

Furthermore, the column decoder 3 and the data input/output buffer 4 are connected to the bit line control circuit 2. A data storage circuit in the bit line control circuit 2 is selected by the column decoder 3, and the data of the memory cell transistors which are read out to the data storage circuit are output from the data input/output terminal 5 through the data input/output buffer 4 to the outside.

Furthermore, the writing data input from the outside to the data input/output terminal 5 are stored through the data input/output buffer 4 into the data storage circuit selected by the column decoder 3.

The row decoder 6 is connected to the memory cell array 1. The row decoder 6 applies a voltage required for read-out, writing or erasure to the word lines of the memory cell array 1.

The source line control circuit 9 is connected to the memory cell array 1. The source line control circuit 9 controls the voltage of the source line.

The well control circuit 10 is connected to the memory cell array 1. The well control circuit 10 controls the voltage of the semiconductor substrate (well) on which the memory cell transistors are formed.

The control circuit 7 controls the memory cell array 1, the bit line control circuit 2, the column decoder 3, the data input/output buffer 4, the row decoder 6, the source line control circuit 9 and the well control circuit 10.

The control circuit 7 executes the control operation in response to a control signal input from the outside through the control signal input terminal 8. That is, the control circuit 7 generates a desired voltage at the time of data programming, verifying, read-out, erasure, and supplies the voltage to each part of the memory cell array 1.

Figure 2:
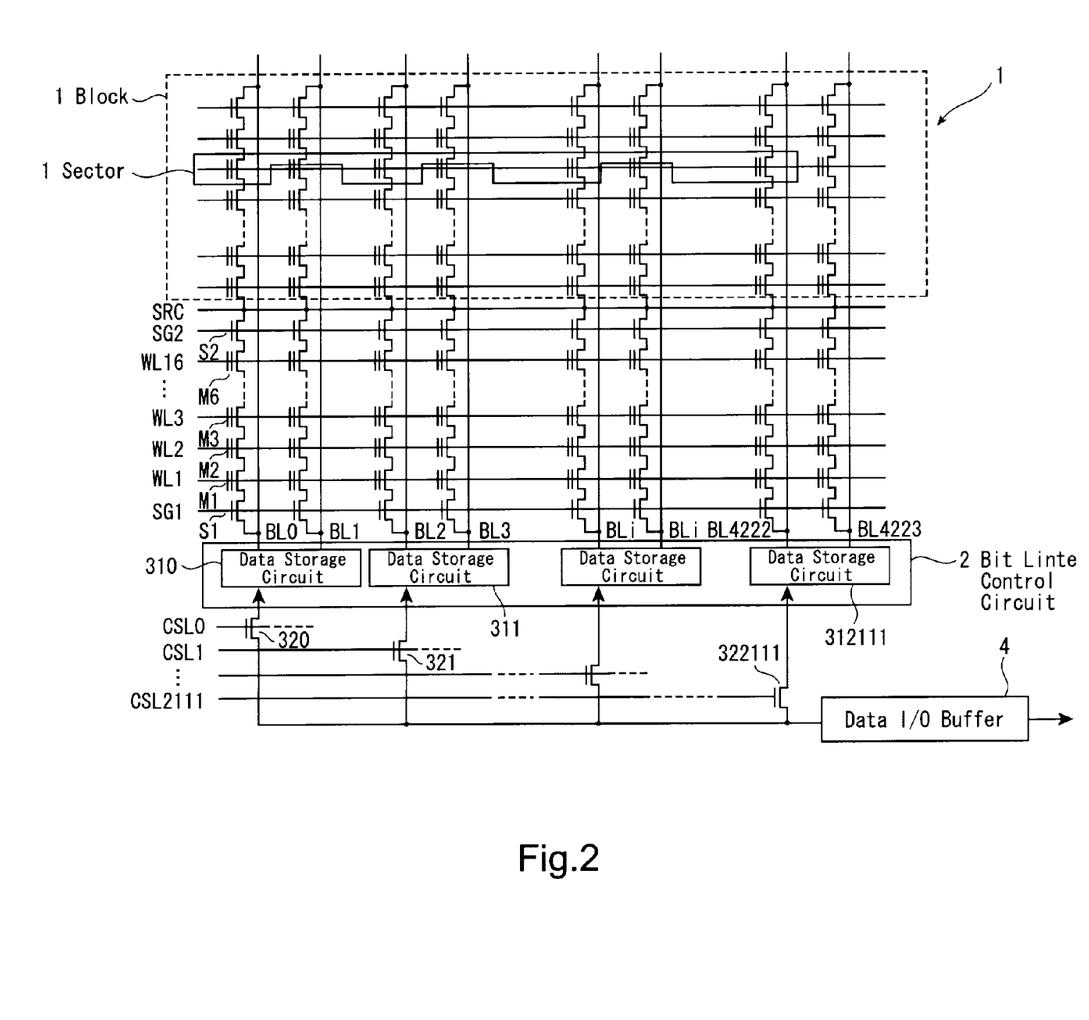
FIG. 2 is a circuit diagram showing the construction according to a first embodiment.

FIG. 2 is a circuit diagram showing the construction containing the memory cell array 1, the bit line control circuit 2 and the data input/output buffer 4 shown in FIG. 1. As shown in FIG. 2, the bit line control circuit 2 has plural data storage circuits 310, 311, . . . , 312111. Each of the data storage circuits 310, 311, . . . , 312111 is connected to the data input/output buffer 4 through each of column select gates 320, 321, . . . , 322111. These column select gates 320, 321, . . . , 322111 are controlled on the basis of column selection signals CSL0, CSL1, . . . , CSL2111 supplied from the column decoder 3.

A pair of bit lines are connected to each of the data storage circuits 310, 311, . . . , 312111. That is, the bit lines BL0 and BL1 are connected to the data storage circuit 310, the bit lines BL2 and BL3 are connected to the data storage circuit 311, and the bit lines BL4222 and BL4223 are connected to the data storage circuit 312111.

Furthermore, as shown in FIG. 2, the plural NAND cell units are connected to the memory cell array 1 as described above.

One NAND cell unit includes for example, 64 memory cell transistors M1, M2, M3, . . . , M64 which are connected to one another in series, a selection gate transistor S1 connected to the memory cell transistor M1, and a selection gate transistor S2 connected to the memory cell transistor M64. The memory cell transistors M1, M2, M3, . . . , M64 are provided every block. The first selection gate transistor S1 is connected to the bit line BL0. The second selection gate transistor S2 is connected to the source line SRC.

The control gates of the memory cell transistors M1, M2, M3, . . . , M64 disposed on the respective lines are connected to word lines WL1, WL2, WL3, . . . , WL64. Furthermore, the gate of the first selection gate transistor S1 is commonly connected to a select line SG1. The gate of the second selection gate transistor is commonly connected to a select line SG2.

Figure 3A:
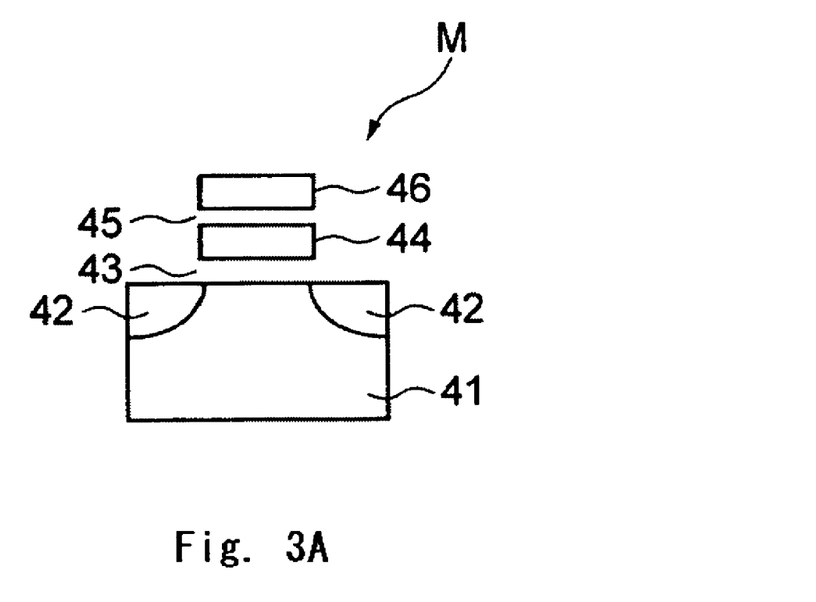
FIG. 3A is a cross-sectional view showing the cross section of the memory cell transistor according to a first embodiment.

FIG. 3A is a cross-sectional view showing the cross section of the memory cell transistor M shown in FIG. 2. As shown in FIG. 3A, the memory cell transistor M has a floating gate 44, a control gate 46 and a diffusion layer 42. The diffusion layer 42 serving as a source/drain region of the memory cell transistor M is formed in a well 41 which is formed on a semiconductor substrate (hereinafter referred to as semiconductor substrate). The floating gate 44 is formed above the well 41 through gate insulating film 43. The control gate 46 is formed above the floating gate 44 through gate insulating film 45.

The memory cell transistor M stores data on the basis of a threshold value voltage thereof. This threshold value voltage is determined by a charge amount accumulated in the floating gate 44, and the charge amount in the floating gate 44 can be varied by tunneling current passing through the gate insulating film 43.

That is, when the control gate 46 is set to sufficiently higher potential as compared with the well 41 and the diffusion layer 42, electrons are injected through the gate insulating film 43 into the floating gate 44, and thus the threshold value voltage increases. On the other hand, the well 41 and the diffusion layer 42 are set to sufficiently higher potential as compared with the control gate 46, electrons are discharged from the floating gate 44 through the gate insulating film 43, and thus the threshold value voltage decreases. As described above, the memory cell transistor M can rewrite data by controlling the charge amount accumulated in the floating gate 44.

Figure 3B:
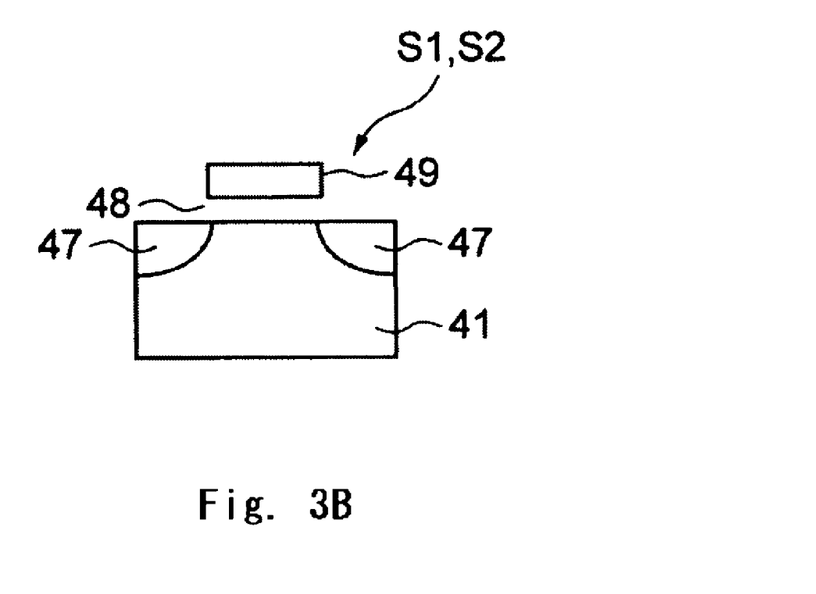
FIG. 3B is a cross-sectional view showing the cross section of the selection gate transistor according to a first embodiment.

FIG. 3B is a cross-sectional view showing the cross section of the selection gate transistor shown in FIG. 2.

As shown in FIG. 3B, a diffusion layer 47 serving as the source/drain regions of the selection gate transistors S1 and S2 is formed in the well 41. Furthermore, a control gate 49 is formed above the well 41 through gate insulating film 48.

Figure 4:
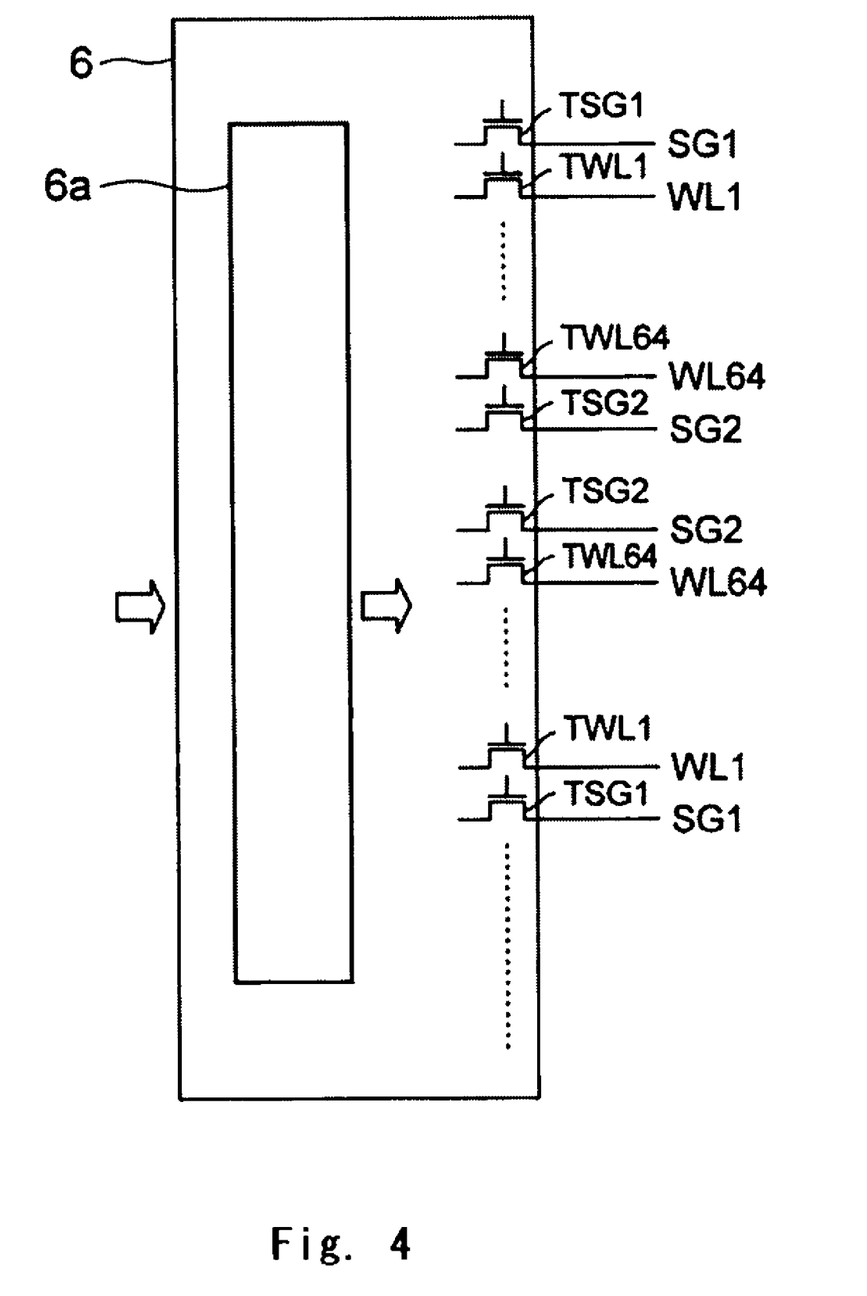
FIG. 4 is a diagram showing an example of the construction of the row decoder according to a first embodiment.

FIG. 4 is a diagram showing an example of the construction of the row decoder 6 shown in FIG. 1. As shown in FIG. 4, the row decoder 6 has plural MOS transistors TSG1, TSG2, TWL1 to TWL64, and a driver circuit 6a. The drains of the MOS transistors TSG1 and TSG2 are connected to the select lines SG1 and SG2 connected to the control gates of the selection gate transistors S1 and S2 shown in FIG. 2. The drains of the MOS transistors TWL1 to TWL64 are connected to the word lines WL1 to WL64 which are connected to the control gates of the memory cell transistors M1 to M64 shown in FIG. 2. The driver circuit 6a controls the gate voltages and the source voltages of the MOS transistors TSG1, TSG2, TWL1 to TWL64 in accordance with the output of the control circuit 7.

The row decoder 6 controls the gate voltage and the source voltage by the driver circuit 6a, whereby the plural MOS transistors TSG1, TSG2 and TWL1 to TWL64 are controlled to select a block. Here, the operation of the NAND type flash memory 100 having the construction described above will be described. The data erasure of the NAND type flash memory 100 is executed every block, that is, it is simultaneously executed on all the memory cell transistors in a selected block.

Figure 5:
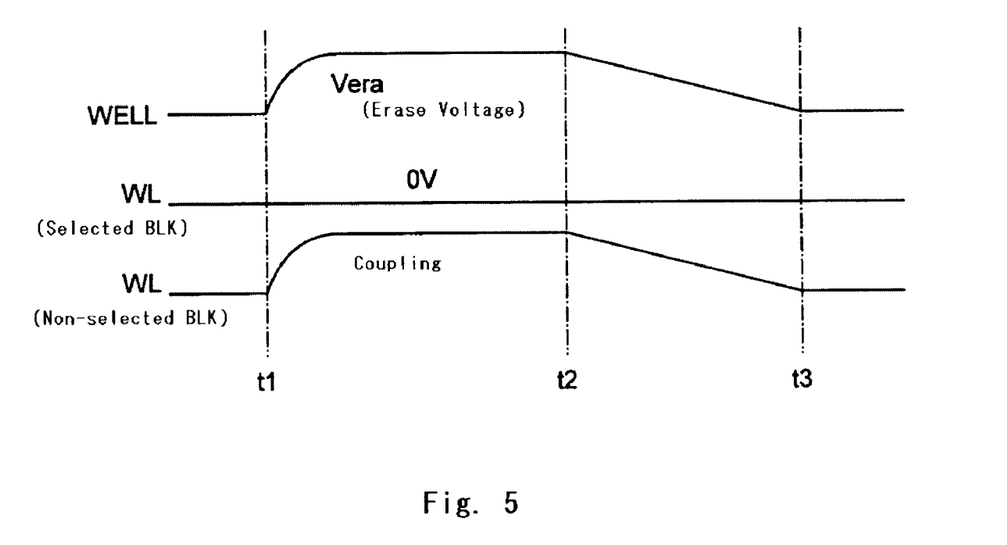
FIG. 5 is a waveform diagram showing the operation of applying the erasing voltage to the well for a constant voltage in the erasing operation of the NAND type flash memory according to a first embodiment.

First, an example (one operation) of an operation sequence of applying the erasing voltage to the well for a constant period in the erasing operation of the NAND type flash memory 100 will be described. FIG. 5 is a waveform diagram showing the operation of applying the erasing voltage to the well for a constant voltage in the erasing operation of the NAND type flash memory 100.

As shown in FIG. 5, the row decoder 6 sets the MOS transistors connected to all the word lines WL of non-selected blocks to OFF state. The source voltages of these MOS transistors are equal to 0V, for example. That is, all the word lines WL of the non-selected blocks are controlled to be under a floating state. The row decoder 6 also sets the selection gate transistors S1 and S2 of the non-selected blocks to OFF state. That is, all the select lines SG1 and SG2 of the non-selected blocks are controlled to be under a floating state.

On the other hand, the row decoder 6 sets the MOS transistors connected to all the word lines WL of the selected block to ON state. That is, all the word lines WL of the selected block are fixed to 0V (ground). The row decoder 6 also sets the selection gate transistors S1 and S2 of the selected block to OFF state. That is, all the select lines SG1 and SG2 of the selected block are controlled to be under a floating state.

As described above, in the erasing operation, the row decoder 6 turns on the first MOS transistors which are contained in the MOS transistors and have drains connected to the word lines connected to the control gates of the memory cell transistors of the selected block, whereby the control gates of the memory cell transistors of the selected block are fixed to a first voltage (0V). Furthermore, the row decoder 6 turns off the second MOS transistors which are contained in the MOS transistors and have drains connected to the word lines connected to the control gates of the memory cell transistors of the non-selected blocks, whereby the control gates of the memory cell transistors of the non-selected blocks are set to the floating state.

Under the above state, the erasing voltage (for example, about 20V) which is boosted by the boosting circuit is applied to the well (semiconductor substrate) by the well control circuit 10 (time t1).

Here, when the erasing voltage (about 20V) is applied to the well, the same level voltage as the boosted erasing voltage (20V) is applied to all the word lines WL of the non-selected blocks due to coupling (time t1 to t2). That is, the voltage WELL of the well increases, and also the voltages of all the word lines WL of the non-selected blocks increase. The respective select lines, the bit lines and the source lines are controlled to the same level voltage (about 20V) as the erasing voltage due to coupling or the like.

That is, a predetermined potential difference required for data erasure does not occur between the floating gate of each of the memory cell transistors of the non-selected blocks and the well (semiconductor substrate). Accordingly, no electron is discharged from the floating gates of the memory cell transistors M of the non-selected blocks to the well, and thus the threshold value voltage does not vary.

On the other hand, at the time t1 to t2, all the word lines WL of the non-selected blocks are still fixed to 0V as described above. Accordingly, a predetermined potential difference occurs between the floating gate and the well (semiconductor substrate). At this time, the respective select lines, the bit lines and the source lines are also controlled to the same level voltage (about 20V) as the erasing voltage due to coupling or the like. That is, the well (semiconductor substrate) and the diffusion layer (source/drain) are set to sufficiently higher potential as compared with the control gates of the memory cell transistors M of the selected block.

Accordingly, electrons are discharged from the floating gates of the memory cell transistors M of the selected block through the gate insulating film to the well, and the threshold value voltage is shifted to the negative side. That is, the data of the memory cell transistors of the selected block are erased.

Subsequently, by reducing the voltage applied to the well, the voltage of the non-selected blocks is also reduced (time t2 to t3). Through the above operation, the operation of applying the erasing voltage to the well once for a constant period is completed. Here, FIG. 6 is a diagram showing the relation between the voltage of the word line of the non-selected block and the erasing time in the erasing operation of the first embodiment 1.

Figure 6:
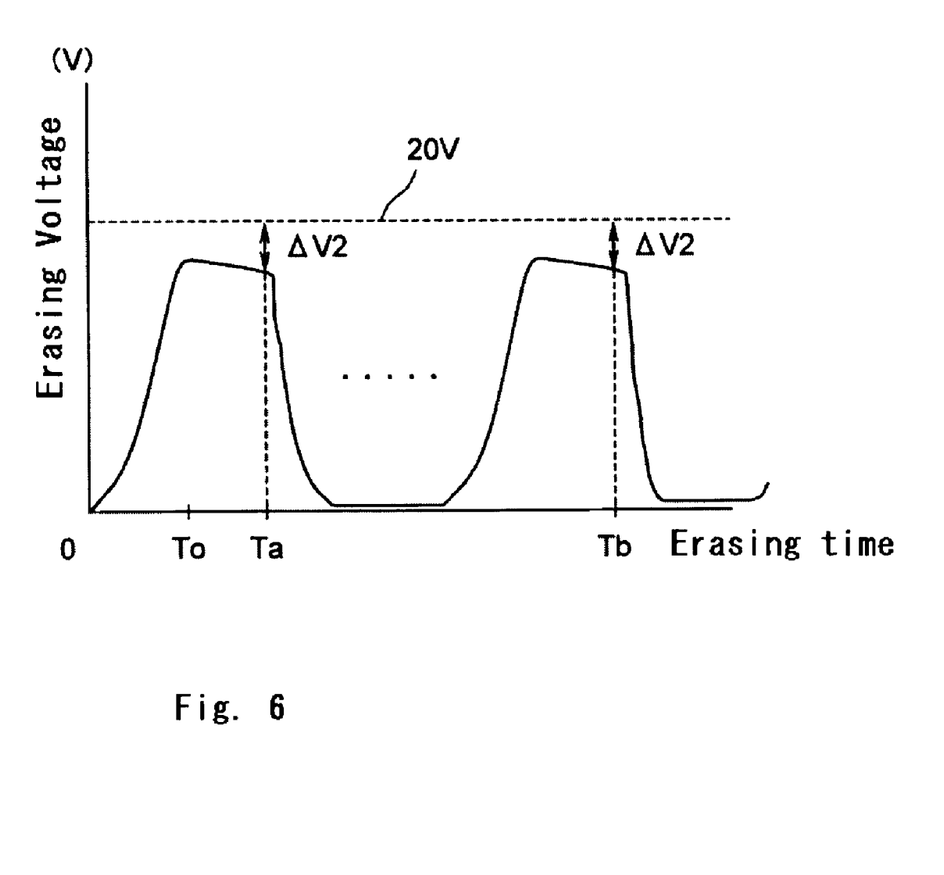
FIG. 6 is a diagram showing the relation between the voltage of the word line of the non-selected block and the erasing time in the erasing operation of the first embodiment 1.

As shown in FIG. 6, for example, the erasing voltage which is boosted to about 20V is applied to the well by the well control circuit 10, whereby the potential of the word lines of the non-selected blocks is boosted to the same level potential as the erasing voltage due to the coupling between the well and the control gates (word lines) (time T0).

Here, as described above, the MOS transistors connected to the word lines of the non-selected blocks are set to OFF state during the period for which the erasing voltage is applied to the well. That is, about 20V is applied to the drains of the MOS transistors, 0V is applied to the gates of the MOS transistors and 0V is applied to the sources of the MOS transistors. When this state is continued, the cut-off characteristics of the MOS transistors are deteriorated, and leak current increases. When current continues to leak, the voltage of the word lines of the non-selected blocks is dropped.

Therefore, in this embodiment, before the voltage drop amount of these word lines increases, the application of the erasing voltage to the well is stopped, and then the application of the erasing voltage to the well is restarted. Accordingly, the voltage drop amount is equal to a potential difference ΔV2 smaller than the potential difference ΔV1 shown in FIG. 11 at time Ta (<Tb). Accordingly, the erroneous erasure in the non-selected blocks can be suppressed. The time Ta is set in such a range that the predetermined potential difference required for data erasure does not occur.

As shown in FIG. 6, the erasing voltage is sequentially applied to the well at plural times, whereby the voltage of the word lines of the non-selected blocks is boosted at plural times. Next, an example of the flow of the erasing operation of the NAND type flash memory 100 using the above operation sequence of applying the erasing voltage to the well for a constant period will be described.

Figure 7:
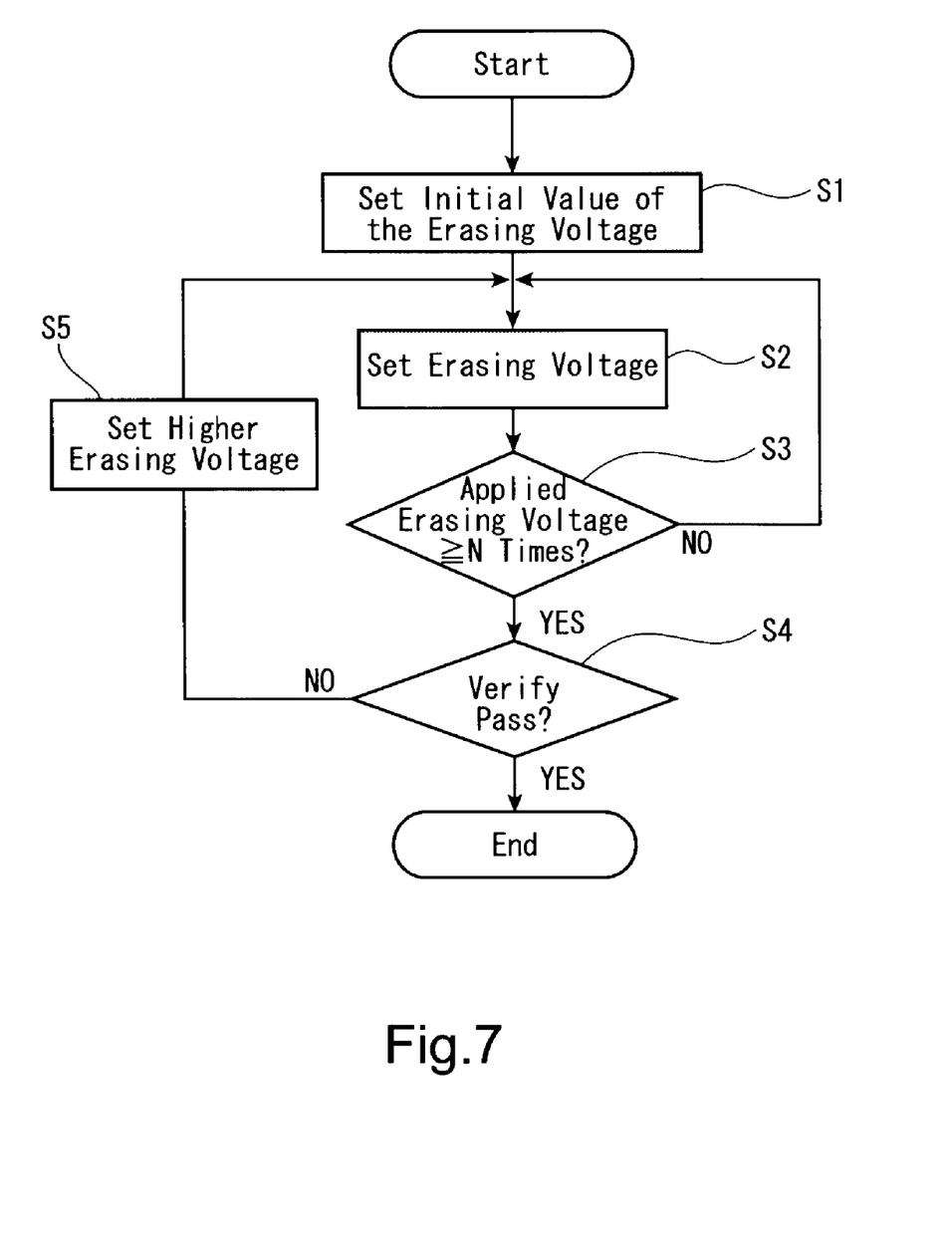
FIG. 7 is a flowchart showing an example of the flow of the erasing operation of the NAND type flash memory according to the first embodiment.

FIG. 7 is a flowchart showing an example of the flow of the erasing operation of the NAND type flash memory 100 according to the first embodiment. As shown in FIG. 7, first, the control circuit 7 sets the initial value of the erasing voltage in accordance with the threshold value voltage or the like which is set in the memory cell transistors (step S1).

Subsequently, the set erasing voltage is applied to the well by the control circuit 7 and the well control circuit 10 through the above-described sequence operation shown in FIG. 5 (step S2).

Subsequently, the control circuit 7 determines whether the erasing voltage is applied to the well at a predetermined specified frequency (N(≧2) times) or more through the above sequence operation (step S3). When the control circuit 7 determines in step S3 that the frequency at which the erasing voltage is applied to the well is less than the N times, the processing returns to step S2, and the erasing voltage is applied to the well through the above sequence operation again.

That is, the erasing voltage higher than the first voltage (0V) described above is applied to the well at only the specified frequency in steps S1 to S3 described above. On the other hand, when the control circuit 7 determines in step S3 that the frequency at which the erasing voltage is applied to the well is equal to N times or more, the control circuit 7 verifies whether the threshold value voltage of the memory cell transistors of the selected block is equal to the first threshold value voltage corresponding to the erasure state or less (step S4).

When the control circuit 7 verifies in this step S4 that the threshold value voltage of the memory cell transistors of the selected block is higher than the first threshold value voltage, the erasing voltage is set to a higher value (step S5), and then the processing is returned to step S2.

In this step S2, the erasing value which is set to the higher value is applied to the well through the sequence operation described above. The same erasing voltage may be applied to the well at only the specified frequency again without setting the erasing voltage to a higher value. Thereafter, it is verified in step S3 again whether the threshold value voltage of the memory cell transistors of the selected block is equal to the first threshold value voltage or less.

On the other hand, when the control circuit 7 verifies in step S4 that the threshold value voltage of the memory cell transistors of the selected block is equal to the first threshold value voltage or less, it is determined that the data are erased, and thus the erasing operation is finished.

As described above, before the erasure verifying operation, the operation of applying the erasing voltage to the well which has been hitherto executed once is divisionally executed while the applying operation is divided into plural operations. Accordingly, the application time of the erasing voltage per one operation can be shortened.

Accordingly, the increase of the leak current due to the deterioration of the cut-off characteristics of the MOS transistors of the row decoder 6 can be suppressed. That is, the voltage drop of the word lines of the non-selected block can be suppressed. That is, the erroneous erasure of data in the non-selected block can be prevented.

Next, another example of the flow of the erasing operation of the NAND type flash memory 100 using the above-described operation sequence of applying the erasing voltage to the well for the constant period will be described.

Figure 8:
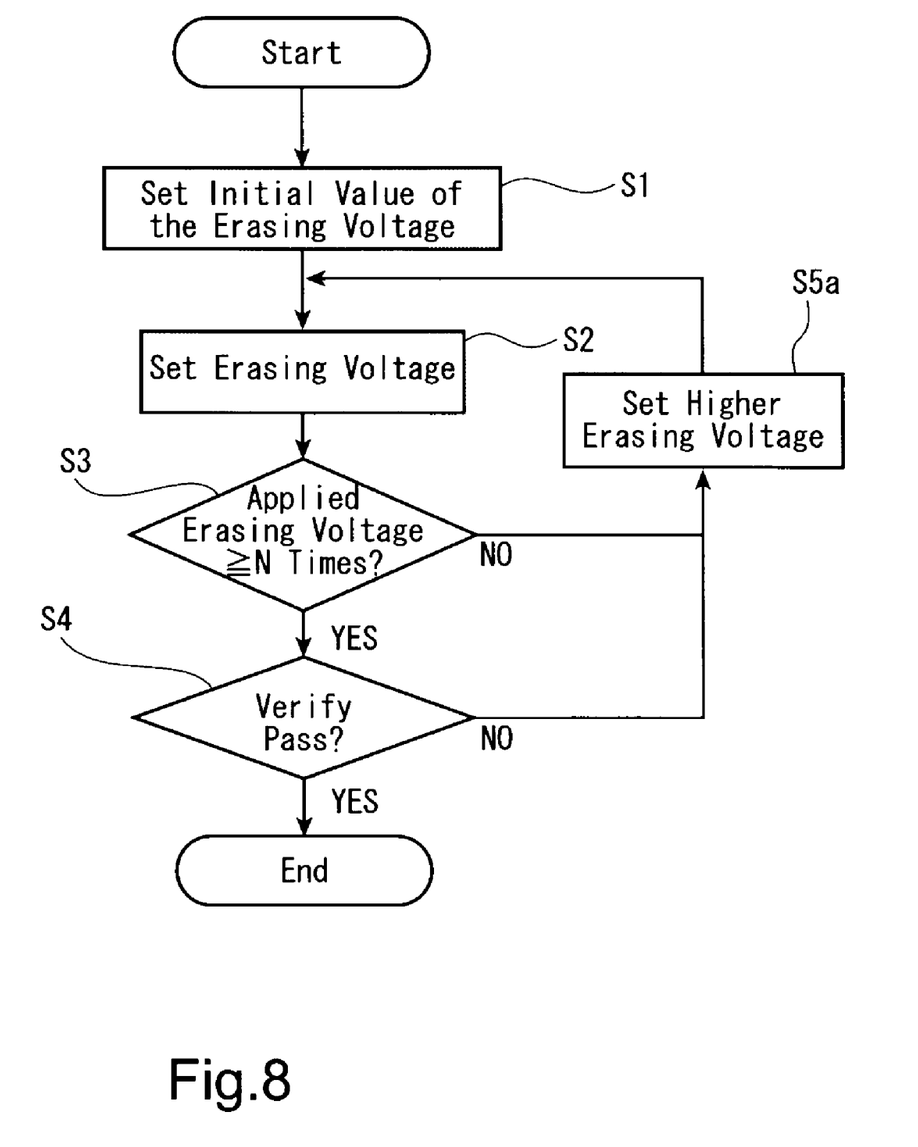
FIG. 8 is a flowchart showing another example of the flow of the erasing operation of the NAND type flash memory according to the first embodiment.

FIG. 8 is a flowchart showing another example of the flow of the erasing operation of the NAND type flash memory 100 according to the first embodiment. As shown in FIG. 8, for example, the control circuit 7 first sets the initial value of the erasing voltage in accordance with the threshold value voltage or the like which is set in the memory cell transistors as in the case of FIG. 7 (step S1).

Subsequently, the control circuit 7 applies the set erasing voltage to the well through the sequence operation shown in FIG. 5 as in the case of FIG. 7 (step S2).

Subsequently, as in the case of FIG. 7, it is determined whether the erasing voltage is applied to the well at a preset specified frequency (N(≧2) times) or more through the sequence operation (step S3). When the control circuit 7 determines in this step S3 that the frequency at which the erasing voltage is applied to the well is less than N times, the control circuit 7 sets the erasing voltage to a higher value (step S5a). Then, the processing is returned to S2, and the erasing voltage which is set to a higher value is applied to the well through the above sequence operation again. That is, in the above steps S1 to S3, S5a, the erasing voltage which is set to be higher than the first voltage (0V) is applied to the well at only the specified frequency while the erasing voltage is stepwise set to a higher value.

On the other hand, when the control circuit 7 determines in step S3 that the frequency at which the erasing voltage is applied to the well is equal to N times or more, the control circuit 7 verifies whether the threshold value voltage of the memory cell transistors of the selected block is equal to the first threshold value voltage corresponding to the erasure state or less (step S4).

When the control circuit 7 verifies in step S4 that the threshold value voltage of the memory cell transistors of the selected block is higher than the first threshold value voltage, the erasing voltage is set to a higher value (step S5a), and then the processing is returned to step S2. In this step S2, the erasing voltage which is set to a higher value is applied to the well through the sequence operation described above.

On the other hand, when the control circuit 7 verifies in step S4 that the threshold value voltage of the memory cell transistors of the selected block is equal to the first threshold value voltage or less, it is determined that the data are erased, and thus the erasing operation is finished.

As described above, before the erasure verifying operation is executed, the operation of applying the erasing voltage to the well which has been hitherto executed once is divisionally executed while the applying operation is divided into plural operations. That is, before the erasure verifying operation is executed, the application of the erasing voltage to the well is sequentially executed at plural times. Accordingly, the application time of the erasing voltage per one operation can be shortened.

Accordingly, the increase of the leak current due to the deterioration of the cut-off characteristics of the MOS transistors of the row decoder 6 can be suppressed. That is, the voltage drop of the word lines of the non-selected blocks can be suppressed. That is, the erroneous erasure of data in the non-selected blocks can be prevented.

Next, another example of the flow of the erasing operation of the NAND type flash memory 100 using the above-described operation sequence of applying the erasing voltage to the well for the constant period will be further described.

Figure 9:
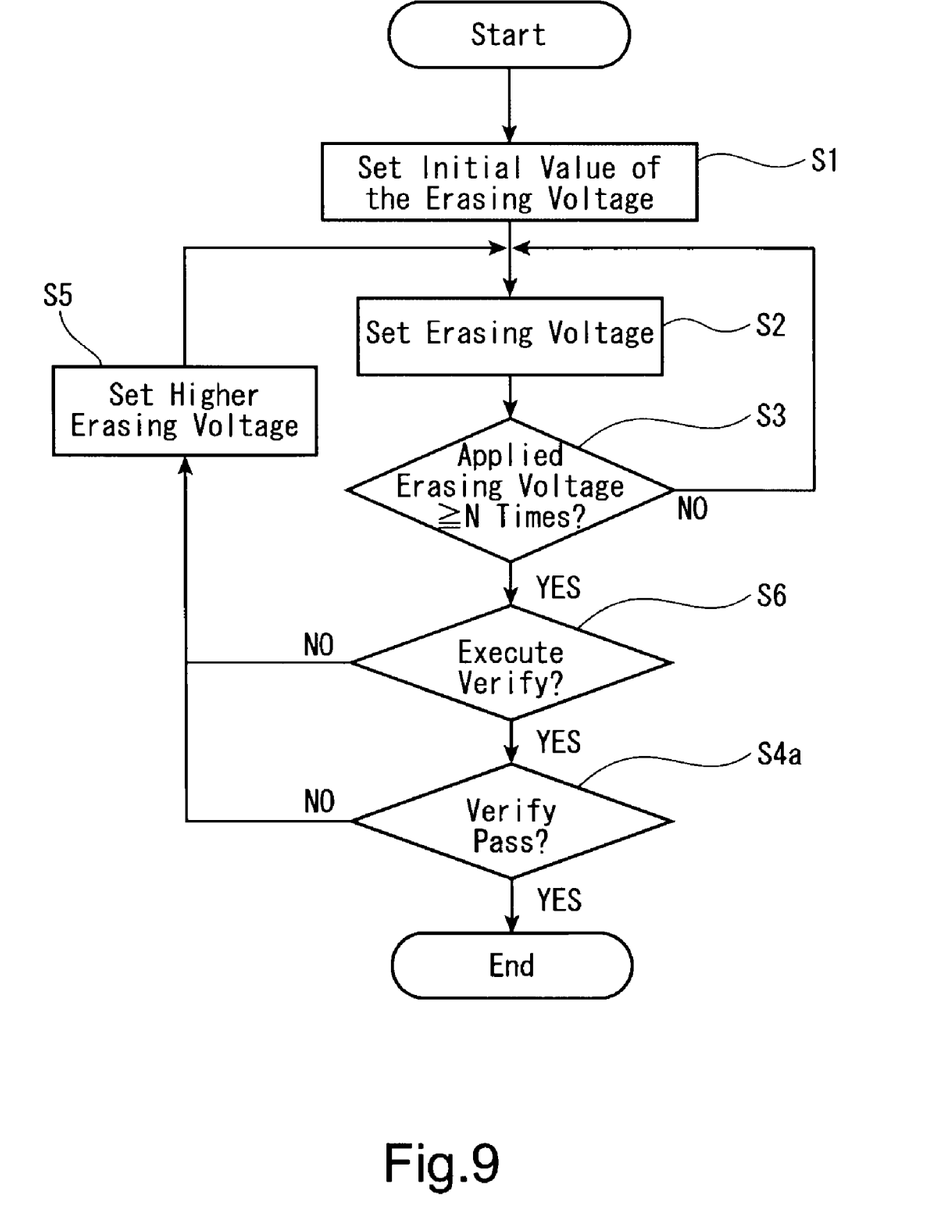
FIG. 9 is a flowchart showing another example of the flow of the erasing operation of the NAND type flash memory according to the first embodiment.

FIG. 9 is a flowchart showing another example of the flow of the erasing operation of the NAND type flash memory 100 according to the first embodiment.

As shown in FIG. 9, as in the case of FIG. 7, for example, the control circuit 7 first sets the initial value of the erasing voltage in accordance with the threshold value voltage or the like which is set in the memory cell transistors (step S1).

Subsequently, as in the case of FIG. 7, the control circuit 7 applies the set erasing voltage to the well through the sequence operation shown in FIG. 5 (step S2).

Subsequently, as in the case of FIG. 7, the control circuit 7 determines whether the erasing voltage is applied to the well at a preset specified frequency N (N(≧2) times) or more through the sequence operation (step S3). When the control circuit 7 determines in step S3 that the frequency at which the erasing voltage is applied to the well is less than N times, the processing returns to step S2, and the erasing voltage is applied to the well through the sequence operation described above.

On the other hand, when the control circuit 7 determines in step S3 that the frequency at which the erasing voltage is applied to the well is equal to N times or more, the control circuit 7 determines on the basis of a preset condition that the erasure verifying operation is executed or not (step S6). This preset condition contains the frequency of verification, the erasing voltage, the threshold value voltage set in the memory cell transistors, etc.

When the control circuit 7 determines in step S6 that the erasure verifying operation is not executed, the erasing voltage is set to a higher value (step S5), and then the processing is returned to step S2. In this step S2, the erasing voltage which is set to a higher value is applied to the well through the sequence operation described above.

On the other hand, when the control circuit 7 determines in step S6 that the erasure verifying operation is executed, the control circuit 7 verifies whether the threshold value voltage of the memory cell transistors of the selected block is equal to the first threshold value voltage corresponding to the erasure state or less (step S4a). When the control circuit 7 verifies in step S4a that the threshold value voltage of the memory cell transistors of the selected block is higher than the first threshold value voltage, the erasing voltage is set to a higher value (step S5), and then the processing is returned to step S2. In this step S2, the erasing voltage which is set to a higher value is applied to the well through the sequence operation described above.

On the other hand, when the control circuit 7 verifies in step S4a that the threshold value voltage of the memory cell transistors of the selected block is equal to the first threshold value voltage or less, it is determined that data are erased, and thus the erasing operation is finished.

As described above, before the erasure verifying operation is executed, the operation of applying the erasing voltage to the well which has been hitherto executed once is divisionally executed while the applying operation is divided into plural operations. That is, before the erasure verifying operation is executed, the application of the erasing voltage to the well is sequentially executed at plural times. Accordingly, the application time of the erasing voltage per one operation can be shortened.

Accordingly, the increase of the leak current due to the deterioration of the cut-off characteristics of the MOS transistors of the row decoder 6 can be suppressed. That is, the voltage drop of the word lines of the non-selected blocks can be suppressed. That is, the erroneous erasure of data in the non-selected blocks can be prevented.

Next, another example of the flow of the erasing operation of the NAND type flash memory 100 using the above-described operation sequence of applying the erasing voltage to the well for the constant period will be further described.

Figure 10:
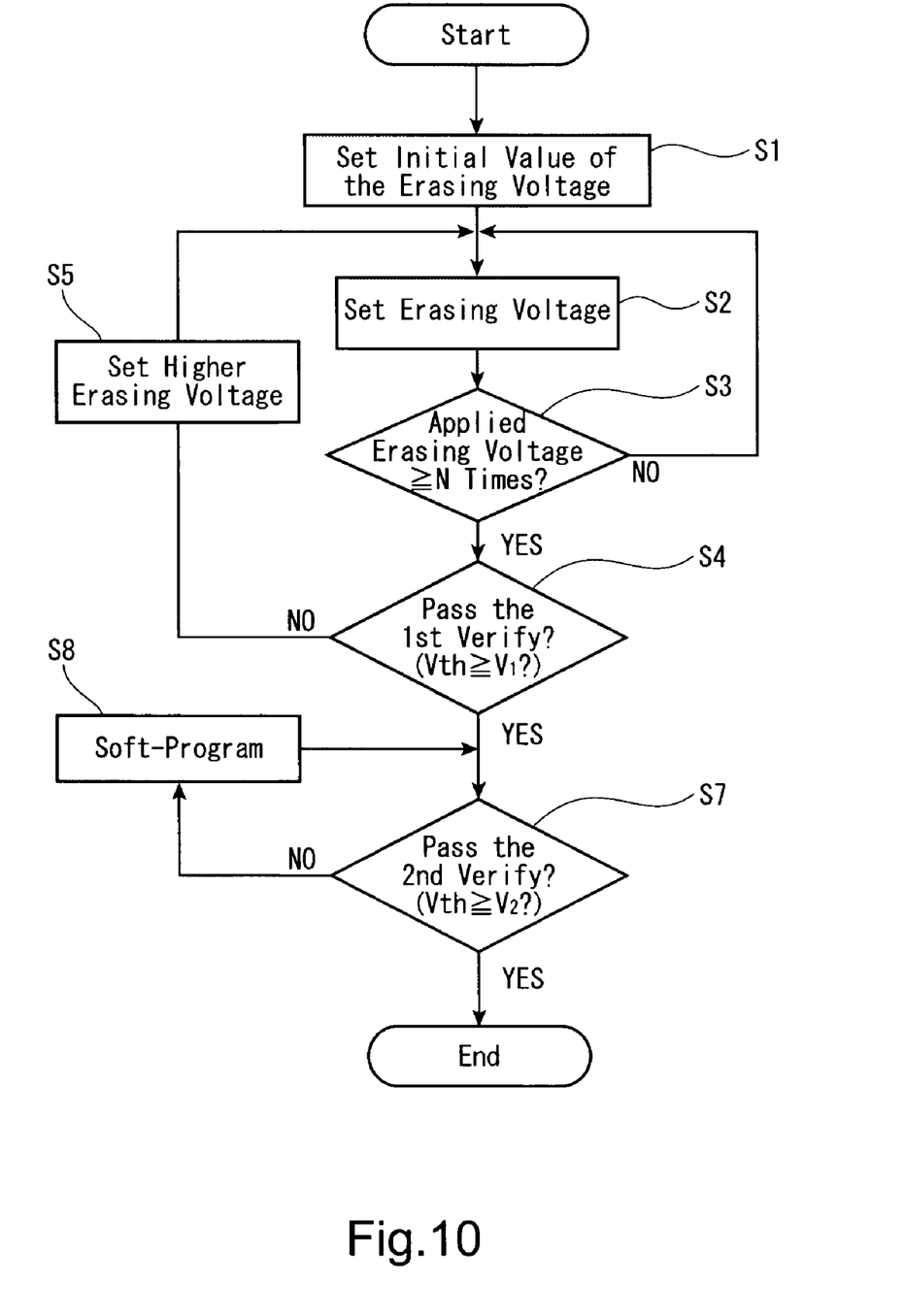
FIG. 10 is a flowchart showing another example of the flow of the erasing operation of the NAND type flash memory according to the first embodiment.

FIG. 10 is a flowchart showing another example of the flow of the erasing operation of the NAND type flash memory 100 according to the first embodiment. As shown in FIG. 10, as in the case of FIG. 7, for example, the control circuit 7 first sets the initial value of the erasing voltage in accordance with the threshold value voltage or the like which is set in the memory cell transistors (step S1).

Subsequently, as in the case of FIG. 7, the control circuit 7 applies the set erasing voltage to the well through the sequence operation shown in FIG. 5 (step S2).

Subsequently, as in the case of FIG. 7, the control circuit 7 determines whether the erasing voltage is applied to the well at a preset specified frequency N (N≧2) times) or more through the sequence operation (step S3).

When the control circuit 7 determines in step S3 that the frequency at which the erasing voltage is applied to the well is less than N times, the processing returns to step S2, and the erasing voltage is applied to the well through the sequence operation described above.

On the other hand, when the control circuit 7 determines in step S3 that the frequency at which the erasing voltage is applied to the well is equal to N times or more, the control circuit 7 verifies whether the threshold value voltage of the memory cell transistors of the selected block is equal to the first threshold value voltage corresponding to the erasure state or less (step S4).

When the control circuit 7 verifies in step S4 that the threshold value voltage of the memory cell transistors of the selected block is higher than the first threshold value voltage, the erasing voltage is set to a higher voltage (step S5), and then the processing is returned to step S2. In this step S2, the erasing voltage which is set to a higher value is applied to the well through the sequence operation described above.

On the other hand, when the control circuit 7 verifies in step S4 that the threshold value voltage of the memory cell transistors of the selected block is equal to the first threshold value voltage or less, the control circuit 7 verifies whether the threshold value voltage of the memory cell transistors of the selected block is equal to or less than a second threshold value voltage which is lower than the first threshold value voltage (step S7).

When the control circuit 7 verifies in step S7 that the threshold value voltage of the memory cell transistors of the selected block is lower than the second threshold value voltage, the control circuit 7 soft-programs the memory cell transistors of the selected block (step S8), and then returns to step S7.

This soft-program is a so-called light writing operation, and the writing voltage, etc. are controlled so that the variation of the threshold value voltage is smaller than that in the normal writing operation.

On the other hand, when the control circuit 7 verifies in step S7 that the threshold value voltage of the memory cell transistors of the selected block is equal to the second threshold value voltage or more, it is determined that data are erased and thus the erasing operation is finished. Accordingly, the threshold value voltage of the memory cell transistors is set in the range of the predetermined threshold value voltage corresponding to the erasure state.

As described above, before the erasure verifying operation is executed, the operation of applying the erasing voltage to the well which has been hitherto executed once is divisionally executed while the applying operation is divided into plural operations. That is, before the erasure verifying operation is executed, the application of the erasing voltage to the well is sequentially executed at plural times. Accordingly, the application time of the erasing voltage per one operation can be shortened.

Accordingly, the increase of the leak current due to the deterioration of the cut-off characteristics of the MOS transistors of the row decoder 6 can be suppressed. That is, the voltage drop of the word lines of the non-selected blocks can be suppressed. That is, the erroneous erasure of data in the non-selected blocks can be prevented.

As described above, according to the NAND type flash memory according to this embodiment, the erroneous erasure of data in the non-selected blocks can be prevented.

What is claimed is:

1. A semiconductor memory device for erasing data comprising:

a plurality of blocks including a plurality of memory cell transistors that are provided in every block and have floating gates formed through first gate insulating film above a well formed in a semiconductor substrate and control gates formed through second gate insulating film above the floating gates, data in the memory cell transistors being rewritable by controlling charge amounts accumulated in the floating gates; and a row decoder having a plurality of MOS transistors having drains that are respectively connected to corresponding word lines connected to the control gates of the plurality of memory cell transistors, the row decoder controlling gate and source voltages of the MOS transistors, wherein in an erasing operation, first MOS transistors that are contained in the MOS transistors and have drains connected to the word lines connected to the control gates of memory cell transistors of a selected block are turned on to fix the control gates of the memory cell transistors of the selected block to a first voltage, and second MOS transistors that are contained in the MOS transistors and have drains connected to the word lines connected to the control gates of memory cell transistors of non-selected blocks are turned off to set the control gates of the memory cell transistors of the non-selected blocks to a floating state, whereby an erasing voltage higher than the first voltage is applied to the well, and when a threshold value voltage of the memory cell transistors of the selected block is higher than a first threshold value voltage, the erasing voltage is applied to the well at only a specified frequency again, wherein the erasing voltage is applied at the specified frequency which is set to twice or more.

2. The semiconductor memory device according to claim 1, wherein after the erasing voltage is applied, it is verified whether a threshold value voltage of the memory cell transistors of the selected block is not more than the first threshold value voltage corresponding to an erasure state.

3. The semiconductor memory device according to claim 1, wherein when a threshold value voltage of the memory cell transistors of the selected block is higher than the first threshold value voltage, the erasing voltage which is set to a higher value is applied to the well, and then it is verified again whether a threshold value voltage of the memory cell transistors of the selected block is not more than the first threshold value voltage.

4. The semiconductor memory device according to claim 3, wherein the erasing voltage which is set to the higher value is applied to the well at the specified frequency.

5. The semiconductor memory device according to claim 1, wherein when a threshold value voltage of the memory cell transistors of the selected block is not more than the first threshold value voltage, it is verified whether a threshold value voltage of the memory cell transistors of the selected block is not less than a second threshold value voltage lower than the first threshold value voltage, and when a threshold value voltage of the memory cell transistors of the selected block is lower than the second threshold value voltage, the memory cell transistors of the selected block are soft-programmed.

6. The semiconductor memory device according to claim 1, wherein when a threshold value voltage of the memory cell transistors of the selected block is not more than the first threshold value voltage, it is verified whether a threshold value voltage of the memory cell transistors of the selected block is not less than a second threshold value voltage lower than the first threshold value voltage, and when a threshold value voltage of the memory cell transistors of the selected block is lower than the second threshold value voltage, the memory cell transistors of the selected block are soft-programmed.

7. A semiconductor memory device for erasing data comprising:

a plurality of blocks including a plurality of memory cell transistors that are provided in every block and have floating gates formed through first gate insulating film above a well formed in a semiconductor substrate and control gates formed through second gate insulating film above the floating gates, data in the memory cell transistors being rewritable by controlling charge amounts accumulated in the floating gates; and a row decoder having a plurality of MOS transistors having drains that are respectively connected to corresponding word lines connected to the control gates of the plurality of memory cell transistors, the row decoder controlling gate and source voltages of the MOS transistors, wherein in an erasing operation, first MOS transistors that are contained in the MOS transistors and have drains connected to the word lines connected to the control gates of memory cell transistors of a selected block are turned on to fix the control gates of the memory cell transistors of the selected block to a first voltage, and second MOS transistors that are contained in the MOS transistors and have drains connected to the word lines connected to the control gates of memory cell transistors of non-selected blocks are turned off to set the control gates of the memory cell transistors of the non-selected blocks to a floating state, whereby the erasing voltage higher than the first voltage is applied to the well at only a specified frequency again while the erasing voltage is stepwise increased, and then it is verified whether a threshold value voltage of the memory cell transistors of the selected block is not more than a first threshold value voltage corresponding to an erasure state, wherein the erasing voltage is applied at the specified frequency which is set to twice or more.

8. The semiconductor memory device according to claim 7, wherein when the threshold value voltage of the memory cell transistors of the selected block is higher than the first threshold value voltage, the erasing voltage which is set to a higher value is applied to the well at only the specified frequency, and then it is verified again whether the threshold value voltage of the memory cell transistors of the selected block is not more than the first threshold value voltage.

9. The semiconductor memory device according to claim 7, wherein when a threshold value voltage of the memory cell transistors of the selected block is not more than the first threshold value voltage, it is verified whether a threshold value voltage of the memory cell transistors of the selected block is not less than a second threshold value voltage lower than the first threshold value voltage, and when a threshold value voltage of the memory cell transistors of the selected block is lower than the second threshold value voltage, the memory cell transistors of the selected block are soft-programmed.

* * * * *